(12) United States Patent
Vercesi et al.

(10) Patent No.: US 10,837,111 B2
(45) Date of Patent: Nov. 17, 2020

(54) HOLDING ARRANGEMENT FOR SUPPORTING A SUBSTRATE CARRIER AND A MASK CARRIER DURING LAYER DEPOSITION IN A PROCESSING CHAMBER, APPARATUS FOR DEPOSITING A LAYER ON A SUBSTRATE, AND METHOD FOR ALIGNING A SUBSTRATE CARRIER SUPPORTING A SUBSTRATE AND A MASK CARRIER

(71) Applicants: Applied Materials, Inc., Santa Clara, CA (US); Tommaso Vercesi, Aschaffenburg (DE); Dieter Haas, San Jose, CA (US); Stefan Bangert, Steinau (DE); Oliver Heimel, Wabern (DE); Daniele Gislon, Venice (IT)

(72) Inventors: Tommaso Vercesi, Aschaffenburg (DE); Dieter Haas, San Jose, CA (US); Stefan Bangert, Steinau (DE); Oliver Heimel, Wabern (DE); Daniele Gislon, Venice (IT)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/542,891

(22) PCT Filed: Jan. 12, 2015

(86) PCT No.: PCT/EP2015/050420
§ 371 (c)(1),
(2) Date: Jul. 11, 2017

(87) PCT Pub. No.: WO2016/112951
PCT Pub. Date: Jul. 21, 2016

(65) Prior Publication Data
US 2018/0030596 A1    Feb. 1, 2018

(51) Int. Cl.
C23C 16/458    (2006.01)
C23C 14/04    (2006.01)
(Continued)

(52) U.S. Cl.
CPC ........ *C23C 16/4587* (2013.01); *C23C 14/042* (2013.01); *C23C 14/12* (2013.01);
(Continued)

(58) Field of Classification Search
None
See application file for complete search history.

(56) References Cited

U.S. PATENT DOCUMENTS

2007/0231111 A1* 10/2007 Heimel ............... B65G 49/061
  414/217
2008/0223294 A1* 9/2008 Gebele ................. C03C 17/002
  118/429
(Continued)

FOREIGN PATENT DOCUMENTS

CN    101892455 A    11/2010
CN    103154304 A    6/2013
(Continued)

OTHER PUBLICATIONS

International Search Report and Written Opinion dated Mar. 31, 2017 for Application No. PCT/EP2015/050420.
(Continued)

*Primary Examiner* — Jethro M. Pence
(74) *Attorney, Agent, or Firm* — Patterson + Sheridan, LLP

(57) ABSTRACT

A holding arrangement for supporting a substrate carrier and a mask carrier during layer deposition in a processing chamber is provided. The holding arrangement includes two or more alignment actuators connectable to at least one of the substrate carrier and the mask carrier, wherein the
(Continued)

holding arrangement is configured to support the substrate carrier in, or parallel to, a first plane, wherein a first alignment actuator of the two or more alignment actuators is configured to move the substrate carrier and the mask carrier relative to each other at least in a first direction, wherein a second alignment actuator of the two or more alignment actuators is configured to move the substrate carrier and the mask carrier relative to each other at least in the first direction and a second direction different from the first direction, and wherein the first direction and the second direction are in the first plane.

13 Claims, 7 Drawing Sheets

(51) Int. Cl.
*C23C 14/50* (2006.01)
*H01L 21/68* (2006.01)
*C23C 14/12* (2006.01)
*C23C 16/04* (2006.01)
*H01L 51/00* (2006.01)

(52) U.S. Cl.
CPC ............ *C23C 14/50* (2013.01); *C23C 16/042* (2013.01); *H01L 21/682* (2013.01); *H01L 51/0011* (2013.01)

(56) References Cited

U.S. PATENT DOCUMENTS

2012/0237682 A1 9/2012 Hong et al.
2013/0342843 A1 12/2013 Tamura

FOREIGN PATENT DOCUMENTS

| EP | 2743371 A1 | 6/2014 |
| JP | 2010270397 A | 12/2010 |
| JP | 2013093279 A | 5/2013 |
| KR | 20100126177 A | 12/2010 |
| KR | 20130046340 A | 5/2013 |
| KR | 20130139867 A | 12/2013 |
| WO | 2012043150 A1 | 4/2012 |

OTHER PUBLICATIONS

Korean Office Action dated Oct. 30, 2018 for Application No. 10-2017-7022624.
Japanese Office Action dated May 29, 2018 for Application No. 2017-536784.
Korean Office Action dated May 1, 2019 for Application No. 10-2017-7022624, 11 pages.
Chinese Office Action dated Mar. 29, 2019 for Application No. 201580072814.9, 14 pages.
Chinese Office Action dated Mar. 29, 2019 for Application No. 201580072814.9, 20 pages.

* cited by examiner

HOLDING ARRANGEMENT FOR SUPPORTING A SUBSTRATE CARRIER AND A MASK CARRIER DURING LAYER DEPOSITION IN A PROCESSING CHAMBER, APPARATUS FOR DEPOSITING A LAYER ON A SUBSTRATE, AND METHOD FOR ALIGNING A SUBSTRATE CARRIER SUPPORTING A SUBSTRATE AND A MASK CARRIER

FIELD

Embodiments of the present disclosure relate to a holding arrangement for supporting a substrate carrier and a mask carrier during layer deposition in a processing chamber, an apparatus for depositing a layer on a substrate, and a method for aligning a substrate carrier supporting a substrate for layer deposition and a mask carrier. Embodiments of the present disclosure particularly relate to a holding arrangement for supporting a substrate carrier and a mask carrier during layer deposition in a processing chamber in a substantially vertical orientation, an apparatus for depositing a layer on a substrate in a substantially vertical orientation, and a method for aligning a substrate carrier supporting a substrate for layer deposition and a mask carrier in a substantially vertical orientation.

BACKGROUND

Several methods are known for depositing a material on a substrate. As an example, substrates may be coated by using an evaporation process, a physical vapor deposition (PVD) process, a chemical vapor deposition (CVD) process, a sputtering process, a spraying process, etc. The process can be performed in a processing chamber of a deposition apparatus, where the substrate to be coated is located. A deposition material is provided in the processing chamber. A plurality of materials, such as small molecules, metals, oxides, nitrides, and carbides may be used for deposition on a substrate. Further, other processes like etching, structuring, annealing, or the like can be conducted in processing chambers.

Coated substrates can be used in several applications and in several technical fields. For instance, an application can be organic light emitting diode (OLED) panels. Further applications include insulating panels, microelectronics, such as semiconductor devices, substrates with thin film transistors (TFTs), color filters or the like. OLEDs are solid-state devices composed of thin films of (organic) molecules that create light with the application of electricity. As an example, OLED displays can provide bright displays on electronic devices and use reduced power compared to, for example, liquid crystal displays (LCDs). In the processing chamber, the organic molecules are generated (e.g., evaporated, sputtered, or sprayed etc.) and deposited as layer on the substrates. The particles pass through a mask having a specific pattern to form an OLED pattern on the substrate.

An alignment of the substrate with respect to the mask and a quality of the processed substrate, in particular of the deposited layer, can be related. As an example, the alignment should be accurate and steady in order to achieve good process results. Systems used for alignment of substrates and masks can be susceptible to external interferences, such as vibrations. Such external interferences can compromise the alignment of the substrate and the mask, which results in a reduced quality of the processed substrate, and in particular the alignment of the deposited layers can be compromised.

In view of the above, a holding arrangement for supporting a substrate carrier and a mask carrier during layer deposition in a processing chamber, an apparatus for depositing a layer on a substrate, and a method for aligning a substrate carrier supporting a substrate for layer deposition and a mask carrier, which overcome at least some of the problems in the art, are beneficial. In particular, there is a need for a holding arrangement, an apparatus for depositing a layer on a substrate, and a method for aligning a substrate carrier supporting a substrate that allow for an accurate and steady alignment of the substrate with respect to the mask, and that provide a reduced sensitivity to external interferences.

SUMMARY

In light of the above, a holding arrangement for supporting a substrate carrier and a mask carrier during layer deposition in a processing chamber, an apparatus for depositing a layer on a substrate, and a method for aligning a substrate carrier supporting a substrate for layer deposition and mask carrier are provided. Further aspects, benefits, and features of the present disclosure are apparent from the claims, the description, and the accompanying drawings.

According to an aspect of the present disclosure, a holding arrangement for supporting a substrate carrier and a mask carrier during layer deposition in a processing chamber is provided. The holding arrangement includes two or more alignment actuators connectable to at least one of the substrate carrier and the mask carrier, wherein the holding arrangement is configured to support the substrate carrier in, or parallel to, a first plane, wherein a first alignment actuator of the two or more alignment actuators is configured to move the substrate carrier and the mask carrier relative to each other at least in a first direction, wherein a second alignment actuator of the two or more alignment actuators is configured to move the substrate carrier and the mask carrier relative to each other at least in the first direction and a second direction different from the first direction, and wherein the first direction and the second direction are in the first plane.

According to another aspect of the present disclosure, a holding arrangement for supporting a substrate carrier during layer deposition in a processing chamber is provided. The holding arrangement includes two or more alignment actuators connectable to the substrate carrier, wherein the holding arrangement is configured to support the substrate carrier in, or parallel to, a first plane, wherein a first alignment actuator of the two or more alignment actuators is configured to move the substrate carrier at least in a first direction, wherein a second alignment actuator of the two or more alignment actuators is configured to move the substrate carrier at least in the first direction and a second direction different from the first direction, and wherein the first direction and the second direction are in the first plane.

According to still another aspect of the present disclosure, a holding arrangement for supporting a mask carrier for masking a substrate during layer deposition in a processing chamber is provided. The holding arrangement includes two or more alignment actuators connectable to the mask carrier, wherein the holding arrangement is configured to support the mask carrier in, or parallel to, a first plane, wherein a first alignment actuator of the two or more alignment actuators is configured to move the mask carrier at least in a first direction, wherein a second alignment actuator of the two or more alignment actuators is configured to move the mask carrier at least in the first direction and a second direction different from the first direction, and wherein the first direction and the second direction are in the first plane.

According to an aspect of the present disclosure, an apparatus for depositing a layer on a substrate is provided. The apparatus includes a processing chamber adapted for layer deposition therein; a holding arrangement as described herein within the processing chamber, in particular wherein the holding arrangement is connectable to a wall portion of the processing chamber; and a deposition source for depositing material forming the layer.

According to another aspect of the present disclosure, a method for aligning a substrate carrier supporting a substrate for layer deposition and a mask carrier is provided. The method includes moving the substrate carrier and the mask carrier relative to each other at least in a first direction by a first alignment actuator of a holding arrangement, wherein the holding arrangement supports the substrate carrier in, or parallel to, a first plane; and moving the substrate carrier and the mask carrier relative to each other at least in the first direction and a second direction by a second alignment actuator of the holding arrangement, wherein the second direction is different from the first direction, and wherein the first direction and the second direction are in the first plane.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. It includes method aspects for carrying out functions of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Figure 1:
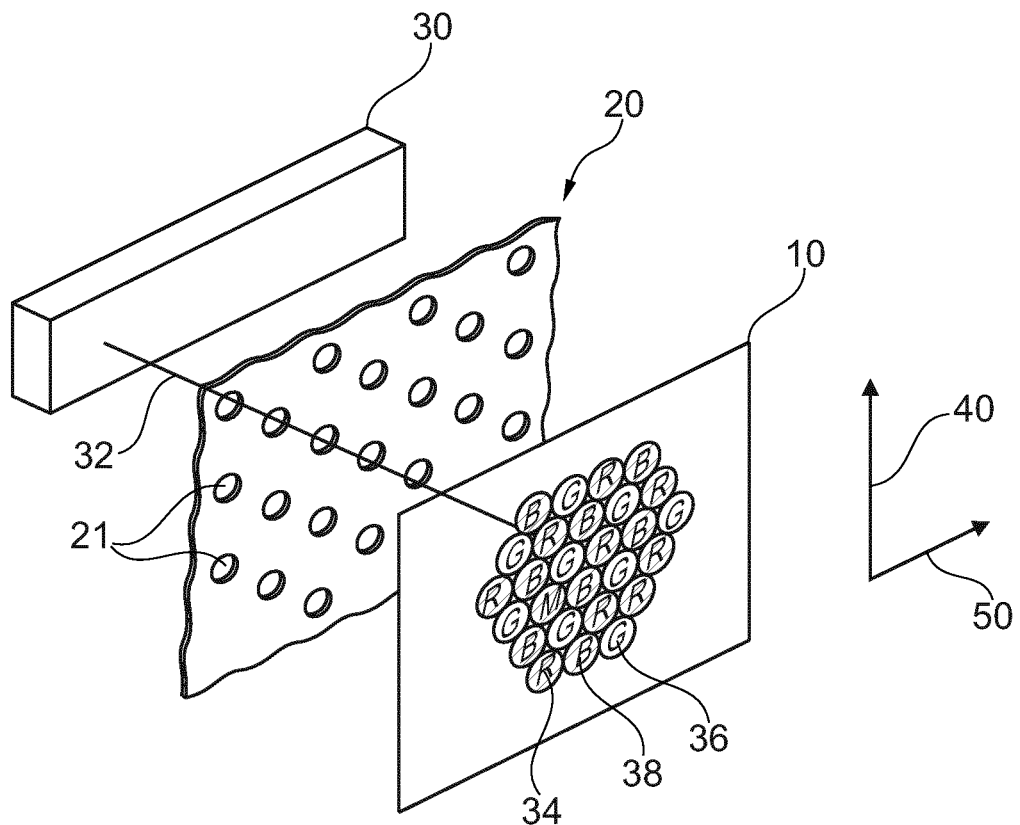
FIG. 1 shows a schematic view of a deposition process using a mask for manufacturing OLEDs on a substrate.

FIG. 1 shows a schematic view of a deposition process for manufacturing OLEDs on a substrate 10.

For manufacturing OLEDs, organic molecules can be generated by a deposition source 30 (e.g., evaporated, sputtered, sprayed etc.) and deposited on the substrate 10. A mask arrangement including a mask 20 is positioned between the substrate 10 and the deposition source 30. The mask 20 has a specific pattern, e.g., provided by a plurality of openings or holes 21, so that organic molecules pass through the openings or holes 21 (e.g., along a path 32) to deposit a layer or film of an organic compound on the substrate 10. A plurality of layers or films can be deposited on the substrate 10 using different masks or positions of the mask 20 with respect to the substrate 10, e.g., to generate pixels with different color properties. As an example, a first layer or film can be deposited to generate red pixels 34, a second layer or film can be deposited to generate green pixels 36, and a third layer or film can be deposited to generate blue pixels 38. The layer(s) or film(s), e.g., an organic semiconductor, can be arranged between two electrodes, such as an anode and a cathode (not shown). At least one electrode of the two electrodes can be transparent.

The substrate 10 and the mask 20 can be arranged in a vertical orientation during the deposition process. In FIG. 1, arrows indicate a vertical direction 40 and a horizontal direction 50.

As used throughout the present disclosure, the term "vertical direction" or "vertical orientation" is understood to distinguish over "horizontal direction" or "horizontal orientation". That is, the "vertical direction" or "vertical orientation" relates to a substantially vertical orientation e.g. of the holding arrangement and the substrate, wherein a deviation of a few degrees, e.g. up to 10° or even up to 15°, from an exact vertical direction or vertical orientation is still considered as a "substantially vertical direction" or a "substantially vertical orientation". The vertical direction can be substantially parallel to the force of gravity.

In the following, embodiments of the present disclosure are described in which a substrate carrier and a mask carrier are provided and the two or more alignment actuators are connected to the substrate carrier. However, the present disclosure is not limited thereto and the two or more alignment actuators can also be connected to the mask carrier. In some implementations, the mask carrier is optional.

Figure 2:
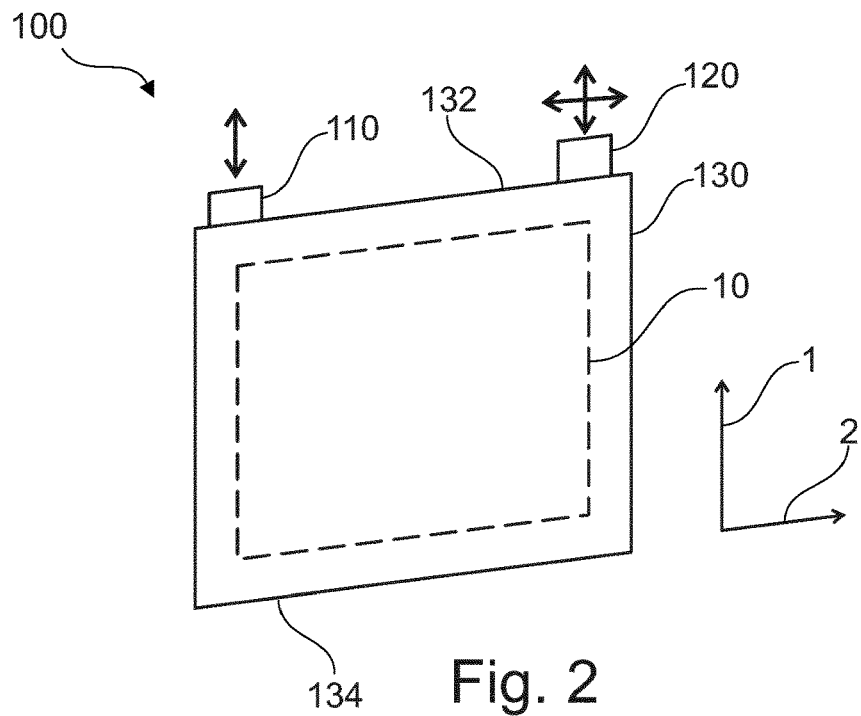
FIG. 2 shows a schematic view of a holding arrangement for supporting a substrate carrier and a mask carrier during layer deposition in a processing chamber according to embodiments described herein.
Figure 3:
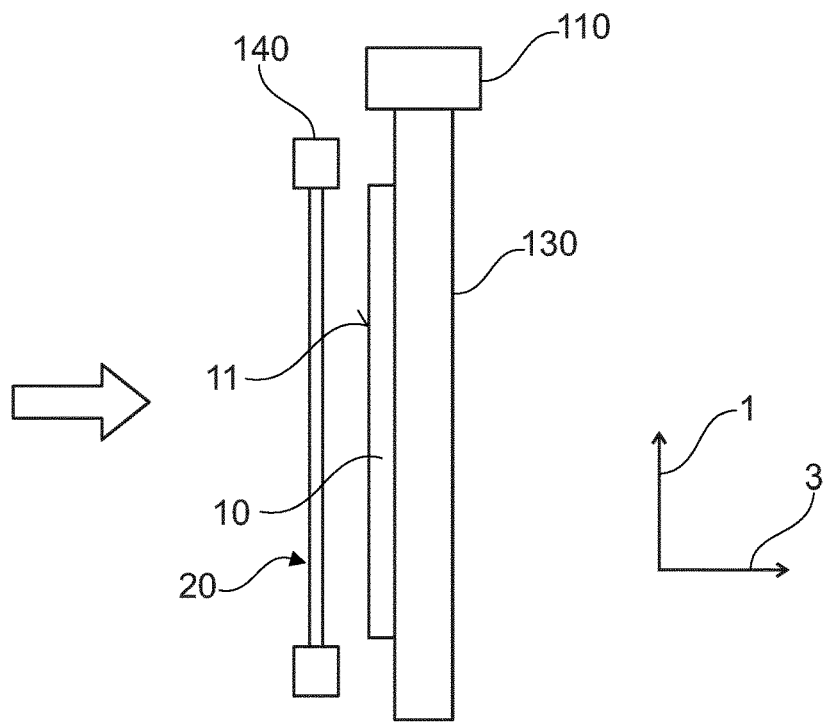
FIG. 3 shows a cross-sectional view of a holding arrangement for supporting a substrate carrier and a mask carrier during layer deposition in a processing chamber according to embodiments described herein.
Figure 4:
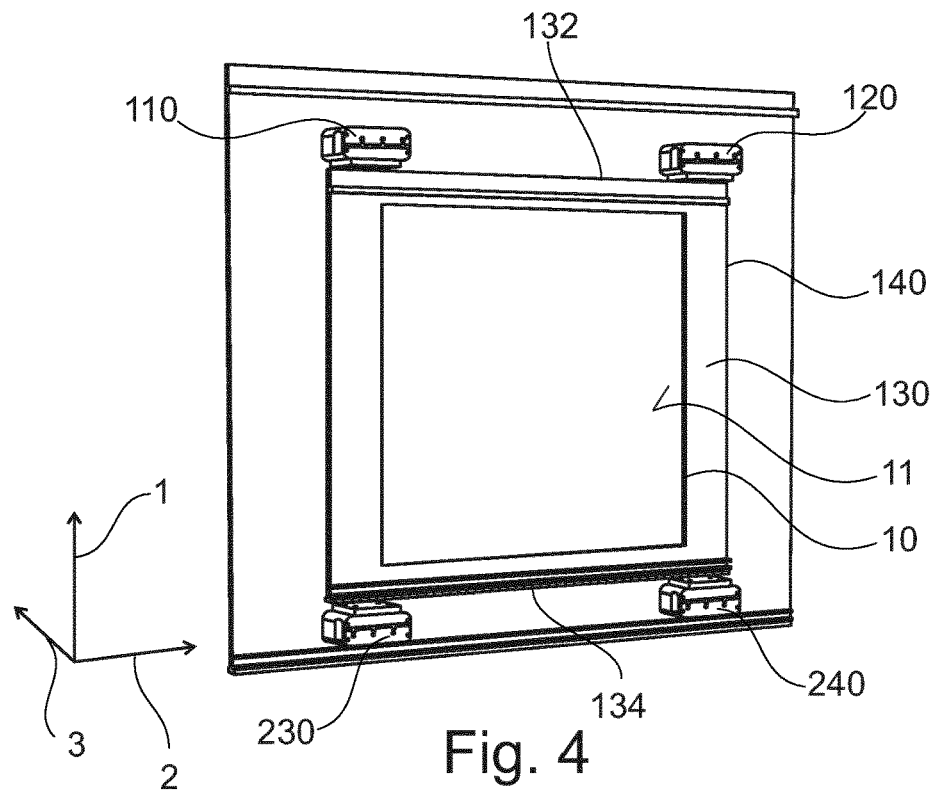
FIG. 4 shows a schematic view of a holding arrangement for supporting a substrate carrier and a mask carrier during layer deposition in a processing chamber according to further embodiments described herein.

FIG. 2 shows a schematic view of a holding arrangement 100 for supporting a substrate carrier 130 and a mask carrier 140 during layer deposition in a processing chamber according to embodiments described herein. FIG. 3 shows a cross-sectional view of the holding arrangement 100 for supporting the substrate carrier 130 and the mask carrier 140 during layer deposition in a processing chamber according to embodiments described herein. FIG. 4 shows a schematic view of the holding arrangement having four alignment actuators.

Alignment systems used on vertical-operated tools can work from outside of a processing chamber, i.e., from the atmospheric side. The alignment system can be connected to a substrate carrier and a mask carrier with stiff arms, e.g., extending through a wall of the processing chamber. A mechanical path between mask carrier or mask and substrate carrier or substrate is long, making the system susceptible to external interference (vibrations, heating, etc.) and tolerances.

In some embodiments, the present disclosure provides a holding arrangement with two or more alignment actuators, which provide a short connection path between the mask carrier and the substrate carrier. The holding arrangement according to the embodiments described herein is less susceptible to external interference, and a quality of the deposited layers can be improved.

The holding arrangement 100 includes two or more alignment actuators connectable to at least one of the substrate carrier 130 and the mask carrier 140, wherein the holding arrangement 100 is configured to support the substrate carrier 130 in, or parallel to, a first plane, wherein a first alignment actuator 110 of the two or more alignment actuators is configured to move the substrate carrier 130 and the mask carrier 140 relative to each other at least in a first direction 1, wherein a second alignment actuator 120 of the two or more alignment actuators is configured to move the substrate carrier 130 and the mask carrier 140 relative to each other at least in the first direction 1 and a second direction 2 different from the first direction 1, and wherein the first direction 1 and the second direction 2 are in the first plane. The two or more alignment actuators can also be referred to as "alignment blocks".

According to some embodiments described herein, which can be combined with other embodiments described herein, a mask 20 can be attached to the mask carrier 140. In some embodiments, the holding arrangement 100 is configured for supporting at least one of the substrate carrier 130 and the mask carrier 140 in a substantially vertical orientation, in particular during layer deposition.

By moving the substrate carrier 130 and the mask carrier 140 relative to each other at least in the first direction 1 and the second direction 2 using the two or more alignment actuators, the substrate carrier 130 can be aligned with respect to the mask carrier 140 or mask 20, and the quality of the deposited layers can be improved.

The two or more alignment actuators can be connectable to at least one of the substrate carrier 130 and the mask carrier 140. As an example, the two or more alignment actuators are connectable to the substrate carrier 130, wherein the two or more alignment actuators are configured to move the substrate carrier 130 relative to the mask carrier 140. The mask carrier 140 can be in a fixed or stationary position. In other examples, the two or more alignment actuators are connectable to the mask carrier 140, wherein the two or more alignment actuators are configured to move the mask carrier 140 relative to the substrate carrier 130. The substrate carrier 130 can be in a fixed or stationary position.

In the holding arrangement of FIG. 4, the two or more alignment actuators include at least one of a third alignment actuator 230 and a fourth alignment actuator 240. The holding arrangement can have four alignment actuators, e.g., first alignment actuator 110, the second alignment actuator 120, the third alignment actuator 230, and the fourth alignment actuator 240. As an example, two or more alignment actuators can be situated on corners or in corner regions of the substrate carrier 130 (or mask carrier 140).

According to some embodiments, which can be combined with other embodiments described herein, the first direction 1 and the second direction 2 can define, or span a plane and can in particular define or span the first plane. As used throughout the specification, the term "plane" can refer to a flat, two-dimensional surface.

As used throughout the specification, the term "direction" can refer to information contained in the relative position of one point with respect to another point. The direction may be specified by a vector. As an example, the first direction 1 can correspond to a first vector, and the second direction 2 can correspond to a second vector. The first direction or first vector and the second direction or second vector can be defined using a coordinate system, for example, a Cartesian coordinate system. According to the embodiments described herein, the second direction 2 is different from the first direction 1. In other words, the second direction 2 is neither parallel nor antiparallel to the first direction 1. As an example, the first vector and the second vector can point in different directions.

In some embodiments, the first direction 1 and the second direction 2 are substantially perpendicular to each other. As an example, the first direction 1 and the second direction 2 can define the first plane in the coordinate system, for example, the Cartesian coordinate system. In some implementations, the first direction 1 can be referred to as "y-direction", and the second direction 2 can be referred to as "x-direction".

According to embodiments described herein, which can be combined with other embodiments described herein, the first direction 1 (y-direction) can correspond to the vertical direction relating to the substantially vertical orientation e.g. of the holding arrangement and the substrate (indicated with reference numeral "40" in FIG. 1). In some implementations, the second direction 2 (x-direction) can correspond to a horizontal direction (indicated with reference numeral "50" in FIG. 1).

According to some embodiments, which can be combined with other embodiments described herein, the two or more alignment actuators are configured to move or align the substrate carrier 130 or mask carrier 140 in, or parallel to, the first plane (e.g., in x-direction and y-direction), and are configured to adjust or change an angular position ("theta") of the substrate carrier 130 or mask carrier 140 in, or parallel to, the first plane.

In some implementations, at least one alignment actuator of the two or more alignment actuators is configured to move the substrate carrier 130 and the mask carrier 140 relative to each other in a third direction 3, in particular wherein the third direction 3 is substantially perpendicular to the first plane and/or a substrate surface 11. As an example, the first alignment actuator 110 and the second alignment actuator 120 are configured to move the substrate carrier 130 or mask carrier 140 in the third direction 3. The third direction 3 can for example be referred to as "z-direction". According to some embodiments, at least one of the third alignment actuator 230 and the fourth alignment actuator 240 is configured to move the substrate carrier 130 or mask carrier 140 in the third direction 3, e.g., substantially perpendicular to the substrate surface 11. In some embodiments, at least one alignment actuator of the third alignment actuator 230 and the fourth alignment actuator 240 is not configured to actively move the substrate carrier 130 in the first direction 1 and the second direction 2. In other words, the at least one alignment actuator of the third alignment actuator 230 and the fourth alignment actuator 240 is configured to move the substrate carrier only in the third direction 3.

In some implementations, a distance between the substrate 10 and the mask 20 can be adjusted by moving the substrate carrier 130 or the mask carrier 140 in the third direction 3. As an example, the distance between the substrate 10, or substrate carrier 130, and the mask 20 can be adjusted to be substantially constant in an area of a substrate surface 11 configured for layer deposition thereon. According to some embodiments, the distance between the substrate 10 or substrate carrier 130 and the mask 20 can be less than 1 mm, specifically less than 500 micrometers, and more specifically less than 50 micrometers.

According to some embodiments, which can be combined with other embodiments described herein, the first alignment actuator 110 is floating with respect to the second direction 2. The term "floating" may be understood as the first alignment actuator 110 allowing a movement of the substrate carrier 130 in the second direction 2, e.g., driven by the second alignment actuator 120. As an example, the first alignment actuator 110 is configured to actively move the substrate carrier 130 in the first direction 1, and is configured to passively allow a movement of the substrate carrier 130 in the second direction 2. In some implementations, the term "floating" may be understood as "freely moveable". As an example, the first alignment actuator 110 can allow a free movement of the substrate carrier 130 in the second direction 2. In other words, the first alignment actuator 110 does not hinder (or interfere with) a movement of the substrate carrier 130 in the second direction 2, e.g., when the second alignment actuator 120 is driven.

According to some embodiments, which can be combined with other embodiments described herein, at least one alignment actuator of the third alignment actuator 230 and the fourth alignment actuator 240 is floating with respect to the first direction 1 and the second direction 2. As an example, at least one alignment actuator of the third alignment actuator 230 and the fourth alignment actuator 240 is floating with respect to the first plane. In some embodiments, the third alignment actuator 230 and the fourth alignment actuator 240 can be configured to (passively) allow a movement of the substrate carrier 130 or mask carrier 140 in the first direction 1 and the second direction 2, e.g., driven by the first alignment actuator 110 and/or the second alignment actuator 120.

The holding arrangement is configured to support the substrate carrier 130 in, or parallel to, the first plane. In some implementations, the first plane is substantially parallel to a plane of the substrate surface 11 configured for layer deposition thereon. As an example, the substrate surface 11 can be an extended surface of the substrate 10 on which one or more layers are to be deposited. The substrate surface 11 can also be referred to as "processing surface of the substrate". The third direction 3 can be substantially perpendicular, or normal, to the substrate surface 11. According to some embodiments, which can be combined with other embodiments described herein, the substrate carrier 130 supporting the substrate 10 is moveable using the two or more alignments actuators substantially parallel to the first plane in at least one of the first direction 1 and the second direction 2, and in particular substantially parallel to the substrate surface 11.

As used throughout the specification, the term "substantially perpendicular" relates to a substantially perpendicular orientation, e.g. of the third direction 3 with respect to the first plane, wherein a deviation of a few degrees, e.g. up to 10° or even up to 15°, from an exact perpendicular orientation is still considered as "substantially perpendicular". Likewise, the term "substantially parallel" relates to a substantially parallel orientation, e.g. of the first direction 1 and the second direction 2 with respect to the first plane, wherein a deviation of a few degrees, e.g. up to 10° or even up to 15°, from an exact parallel orientation is still considered as "substantially parallel".

According to some embodiments, which can be combined with other embodiments described herein, the holding arrangement 100 is configured for supporting at least one of the substrate carrier 130 and the mask carrier 140 in the substantially vertical orientation. In some embodiments, the first plane is a vertical plane when the holding arrangement, and in particular the substrate carrier 130, is in the substantially vertical orientation. The term "orientation" as used herein can be understood as referring to a positioning, e.g., of the substrate 10 or substrate carrier 130 in space, e.g., the three-dimensional space.

According to some embodiments, which can be combined with other embodiments described herein, substantially vertically is understood particularly when referring to the substrate orientation, to allow for a deviation from the vertical direction of 20° or below, e.g. of 10° or below. This deviation can be provided for example because a substrate support with some deviation from the vertical orientation might result in a more stable substrate position or to avoid contaminations. Yet, the substrate orientation during deposition of the organic material is considered substantially vertical, which is considered different from the horizontal substrate orientation.

In some implementations, the substrate carrier 130 can include a frame or plate providing a support surface configured for supporting the substrate 10. As an example, the substrate carrier 130 can have a substantially rectangular shape. The support surface can be substantially parallel to the first plane. The term "substantially parallel" relates to a substantially parallel orientation of the support surface and the first plane, wherein a deviation of a few degrees, e.g. up to 10° or even up to 15°, from an exact parallel orientation is still considered as "substantially parallel".

The substrate carrier 130 can have a first edge portion 132 and a second edge portion 134. The first edge portion 132 and the second edge portion 134 can be located on opposing sides of the substrate carrier 130. A substrate area of the substrate carrier 130, in which the substrate 10 can be positioned, can be provided between the first edge portion 132 and the second edge portion 134. As an example, the first edge portion 132 can be an upper edge portion or top edge portion of the substrate carrier 130. The second edge portion 134 can be a lower edge portion or bottom edge portion of the substrate carrier 130. The first edge portion 132 and the second edge portion 134 can be horizontal edge portions of the substrate carrier 130, when the substrate carrier 130 is in the substantially vertical orientation.

According to some embodiments, which can be combined with other embodiments described herein, the first alignment actuator 110 and the second alignment actuator 120 are provided at the first edge portion 132 or the second edge portion 134. In some implementations, the first alignment actuator 110 and the second alignment actuator 120 can be provided in corners or corner regions of the substrate carrier 130, for example, in corners or corner regions of the first edge portion 132 or the second edge portion 134.

According to some embodiments, which can be combined with other embodiments described herein, the third alignment actuator 230 and the fourth alignment actuator 240 are provided at the first edge portion 132 or the second edge portion 134. As an example, the first alignment actuator 110 and the second alignment actuator 120 are provided at the first edge portion 132, and the third alignment actuator 230 and the fourth alignment actuator 240 are provided at the second edge portion 134. In other examples, the first alignment actuator 110 and the second alignment actuator 120 are provided at the second edge portion 134, and the third alignment actuator 230 and the fourth alignment actuator 240 are provided at the first edge portion 132.

According to some embodiments, which can be combined with other embodiments described herein, the two or more alignment actuators can be electric or pneumatic actuators. The two or more alignment actuators can for example be linear alignment actuators. In some implementations, the two or more alignment actuators can include at least one actuator selected from the group consisting of: a stepper actuator, a brushless actuator, a DC (direct current) actuator, a voice coil actuator, and a piezoelectric actuator. The term "actuator" can, according to some implementations, refer to motors, e.g., stepper motors. The two or more alignment actuators can be configured to move or position the substrate carrier 130 with a precision of less than about plus/minus 1 micrometer. As an example, the two or more alignment actuators can be configured to move or position the substrate carrier 130 with a precision of about plus/minus 0.5 micrometer, and specifically about 0.1 micrometer, in at least one of the first direction 1, the second direction 2, and the third direction 3.

In some implementations, moving of the substrate carrier 130 in at least one of the first direction 1, the second direction 2 and the third direction 3 can by performed by simultaneously or sequentially driving the two or more alignment actuators.

The two or more alignment actuators can be configured to independently and/or differently move the substrate carrier 130 and the mask carrier 140 relative to each other in the third direction 3. As an example, the two or more alignment actuators can be configured to move the substrate carrier 130 or the mask carrier 140 by different amounts in the third direction 3. One alignment actuator of the two or more alignment actuators can be configured to move the substrate carrier 130 or the mask carrier 140 by a first amount in the third direction 3. Another alignment actuator of the two or more alignment actuators can be configured to move the substrate carrier 130 or the mask carrier 140 by a second amount in the third direction 3. The first amount and the second amount can be different. By providing the two or more alignment actuators that move the substrate carrier 130 or the mask carrier 140 by different amounts, an alignment of the mask and the substrate (e.g., mask and substrate planes) can be improved.

According to some embodiments, which can be combined with other embodiments described herein, the mask carrier 140 can include a mask frame having one or more frame elements. The one or more frame elements can define an aperture opening configured for accommodating the mask 20. The one or more frame elements can provide a mask support surface configured for supporting the mask 20. In some implementations, the one or more frame elements can be separate elements that are connectable to form the mask frame, or can be integrally formed. In some embodiments, the mask frame can have a substantially rectangular shape.

In some implementations, the one or more frame elements include a first frame element, a second frame element, a third frame element, and a fourth frame element. As an example, the first frame element and the second frame element can be referred to as top bar and bottom bar, respectively. The first frame element and the second frame element can also be referred to as horizontal frame elements. The third frame element and the fourth frame element can be referred to as sidebars or vertical frame elements. In some embodiments, the first frame element and the second frame element are arranged in parallel, and/or the third frame element and the fourth frame element are arranged in parallel.

According to some embodiments, the at least one frame element can be a horizontal frame element when the holding arrangement is in the substantially vertical orientation. The at least one frame element can in particular be the first frame element, e.g., the top bar, and/or the at least one frame element can be the second frame element, e.g., the bottom bar.

In some implementations, the one or more frame elements can define a second plane, wherein the second plane can be a vertical plane when the mask frame is in the substantially vertical orientation. The second plane can be substantially parallel to the first plane. The second plane can be substantially parallel to a surface of the mask 20 having openings or holes configured for letting the deposition material pass through it (e.g., denoted with reference numeral "21" in FIG. 1).

Figure 5:
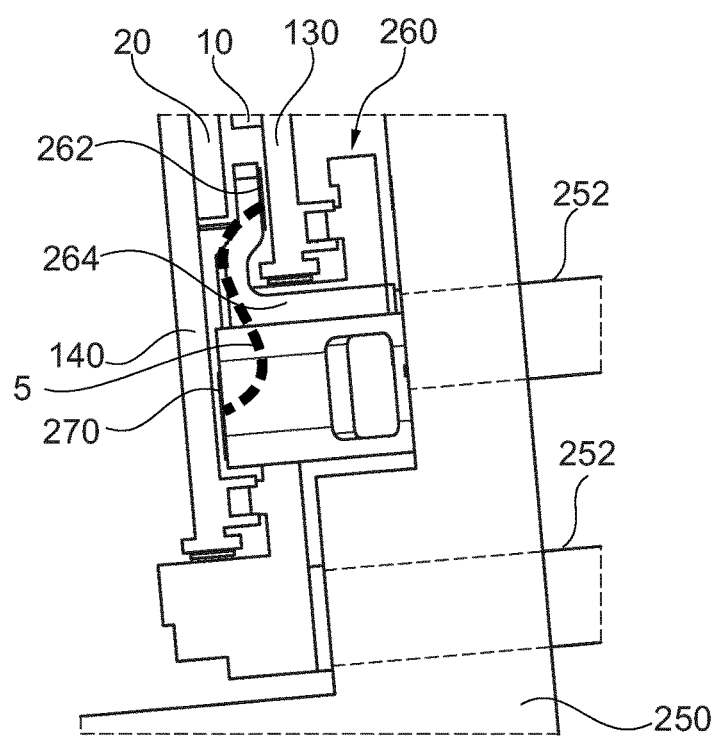
FIG. 5 shows a cross-sectional view of a section of a holding arrangement for supporting a substrate carrier and a mask carrier during layer deposition in a processing chamber according to embodiments described herein.

FIG. 5 shows a cross-sectional view of a section of a holding arrangement for supporting the substrate carrier 130 during layer deposition in a processing chamber according to embodiments described herein.

In some implementations, the holding arrangement with two or more alignment actuators provides a short connection path between the mask carrier 140 (or mask) and the substrate carrier 130 (or substrate). The short connection path is indicated with reference numeral "5" in FIG. 5. The holding arrangement is less susceptible to external interference, and a quality of the deposited layers can be improved.

The holding arrangement can be mounted to a chamber wall 250 of the processing chamber, for example, by mounting devices 252. At least one of the mounting devices 252 can be configured as a feed-through, e.g., for providing an electrical connection between the two or more alignment actuators in the processing chamber and a controller at the atmospheric side.

In some implementations, a first fixing device 260 includes a magnet 262 configured to fix or hold the substrate carrier 130, e.g., a plate of the substrate carrier 130, by a magnetic force. The first fixing device 260 can include a moveable arm 264. The moveable arm 264 can be configured to move the substrate carrier 130 in the third direction, e.g., the z-direction, for alignment of the substrate carrier 130. In some implementations, the magnet 262 can be attached to the moveable arm 264.

According to some embodiments, which can be combined with other embodiments described herein, the holding arrangement includes the one or more first fixing devices 260 configured for fixing or clamping the substrate carrier 130. As an example, the one or more first fixing devices 260 are first magnetic fixing devices. In some implementations, the one or more first fixing devices 260 can be magnetic chucks. The one or more first fixing devices 260 can be included in the two or more alignment actuators. As an example, each alignment actuator of the two or more alignment actuators can include one or more first fixing devices 260.

According to some embodiments, which can be combined with other embodiments described herein, the holding arrangement can include one or more second fixing devices 270 configured for fixing or clamping the mask carrier 140 or a mask plate of the mask carrier 140. As an example, the one or more second fixing devices 270 are second magnetic fixing devices. In some implementations, the one or more second fixing devices 270 can be magnetic chucks.

Figure 6:
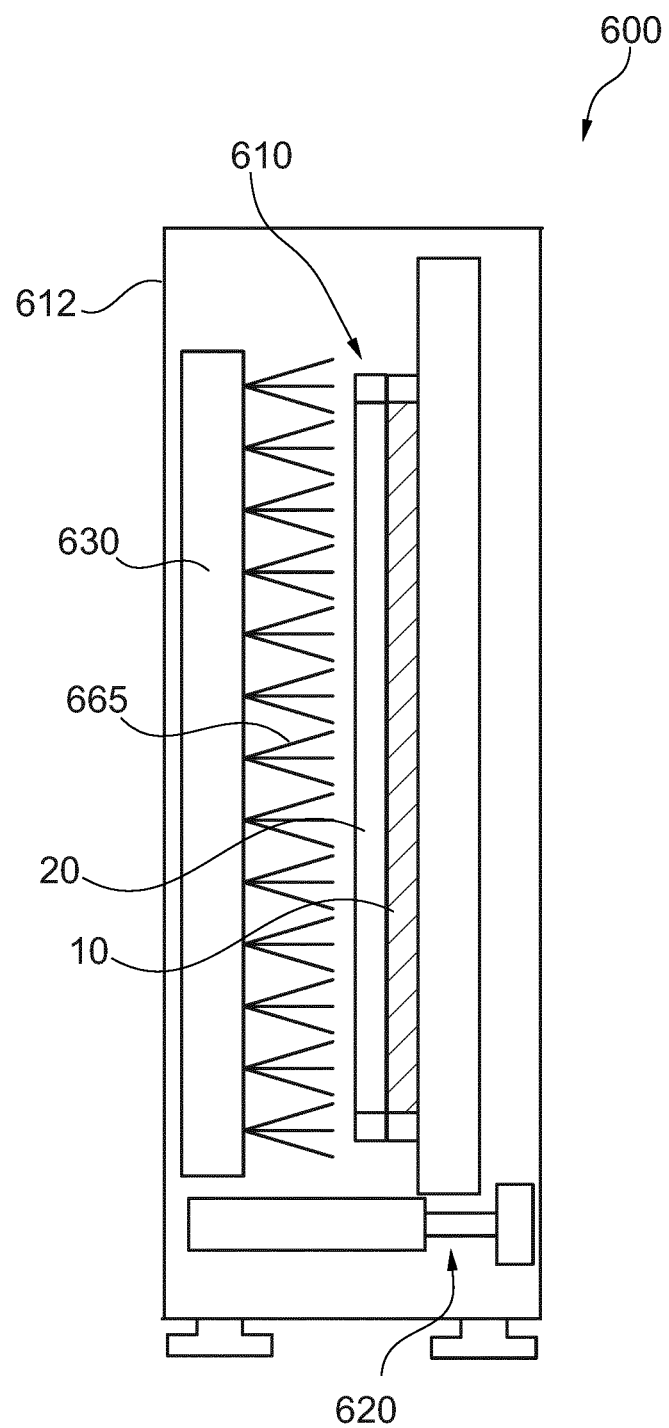
FIG. 6 shows a schematic view of an apparatus for depositing a layer on a substrate having the holding arrangement according to embodiments described herein.

FIG. 6 shows a schematic view of an apparatus 600 for depositing a layer on a substrate 10 according to embodiments described herein.

The apparatus 600 includes a processing chamber 612 adapted for layer deposition therein, a holding arrangement 610 within the processing chamber 612, and a deposition source 630 for depositing material forming the layer. The processing chamber can be a vacuum processing chamber. The holding arrangement 610 can be configured according to the embodiments described herein. As an example, the holding arrangement 610 is connectable to a wall portion of the processing chamber 612. The holding arrangement 610 can hold a mask carrier with a mask 20 mounted thereon.

The apparatus 600 is adapted for a deposition process, such as a thermal evaporation process, a PVD process, a CVD process, a sputter process, etc. A substrate 10 is shown being located within or at the holding arrangement 610 on a substrate transport device 620. The deposition source 630 is provided in the processing chamber 612 facing the side of the substrate 10 to be coated. The deposition source 630 provides deposition material to be deposited on the substrate 10.

The deposition source 630 may be a target with deposition material thereon or any other arrangement allowing material to be released for deposition on substrate 10. In some embodiments, the deposition source 630 may be a rotatable target. According to some embodiments, the deposition source 630 may be movable in order to position and/or replace the deposition source 630. According to other embodiments, the deposition source 630 may be a planar target. Dashed lines 665 show exemplarily the path of the deposition material during operation of the processing chamber 612.

According to some embodiments, the deposition material may be chosen according to the deposition process and the later application of the coated substrate. As an example, the deposition material can be an organic material used in the manufacturing of OLEDs. For instance, the deposition material of the deposition source 630 may be a material including small molecules, polymers, and phosphorescent materials. As an example, the deposition material can be selected from the group including: chelates (e.g., Alq$_3$), fluorescent and phosphorescent dyes (e.g., perylene, rubrene, quinacridone derivatives, etc) and conjugated dendrimers.

The term "substrate" as used herein shall embrace substrates which are typically used for display manufacturing, such as glass or plastic substrates. For example, substrates as described herein shall embrace substrates which are typically used for an OLED display, a LCD (Liquid Crystal Display), a PDP (Plasma Display Panel), and the like. Unless explicitly specified otherwise in the description, the term "substrate" is to be understood as "large area substrate" as specified herein. According to the present disclosure, large area substrates may have a size of at least 0.174 m$^2$. The size of a large area substrate can be about 1.4 m$^2$ to about 8 m$^2$, more typically about 2 m$^2$ to about 9 m$^2$ or even up to 12 m$^2$.

Figure 7:
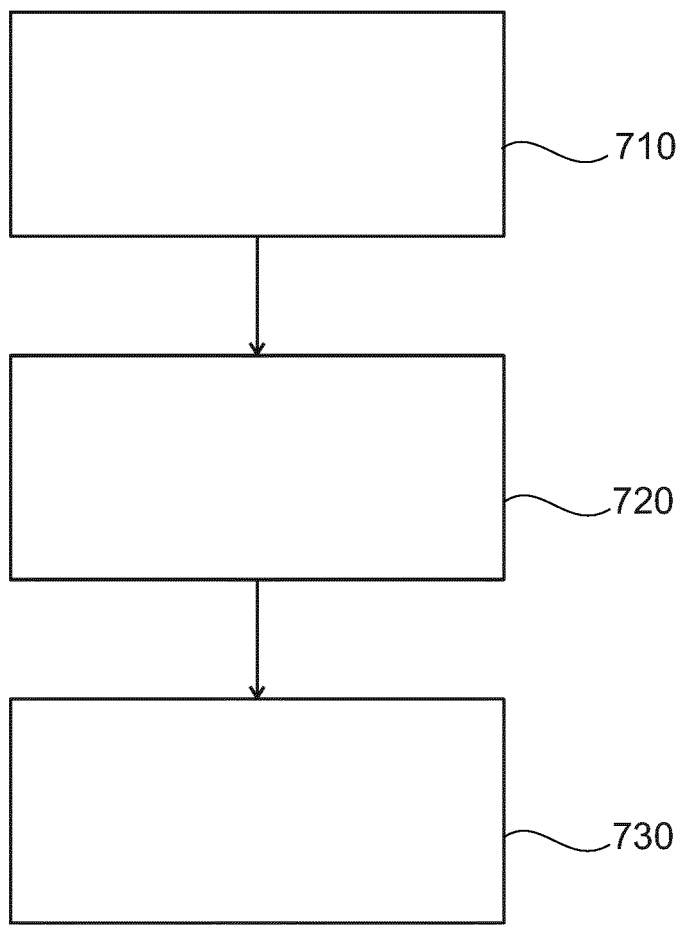
FIG. 7 shows a flow chart of a method for aligning a substrate carrier supporting a substrate for layer deposition in a processing chamber and a mask carrier according to embodiments described herein.

FIG. 7 shows a flow chart of a method 700 for aligning a substrate carrier supporting a substrate for layer deposition and a mask carrier, e.g., in a processing chamber, according to embodiments described herein.

The method 700 includes, in block 710, moving the substrate carrier and the mask carrier relative to each other at least in a first direction by a first alignment actuator of a holding arrangement, wherein the holding arrangement supports the substrate carrier in, or parallel to, a first plane; and, in block 720, moving the substrate carrier and the mask carrier relative to each other at least in the first direction and a second direction using a second alignment actuator of the holding arrangement, wherein the second direction is different from the first direction, and wherein the first direction and the second direction are in the first plane.

The moving of the substrate carrier and the mask carrier relative to each other in the first direction can for example by performed by simultaneously or sequentially driving the first alignment actuator and the second alignment actuator. In some implementations, moving of the substrate carrier and the mask carrier relative to each other in the first direction and the second direction can by performed by simultaneously or sequentially moving the substrate carrier or the mask carrier in the first direction and the second direction.

In some implementations, the first plane is substantially parallel to a plane of a substrate surface of the substrate configured for layer deposition thereon. According to some embodiments, the method includes moving of the substrate carrier and the mask carrier relative to each other in a third direction, in particular wherein the third direction is substantially perpendicular to the first plane. In some implementations, moving of the substrate carrier and the mask carrier relative to each other in the third direction can be performed by simultaneously or sequentially moving the substrate carrier or the mask carrier in the third direction. The two or more alignment actuators can be configured to independently and/or differently move the substrate carrier and the mask carrier relative to each other in the third direction. As an example, the two or more alignment actuators can move the substrate carrier or the mask carrier each by different amounts in the third direction. By providing the two or more alignment actuators that can move the substrate carrier or the mask carrier by different amounts, an alignment of the mask and substrate (e.g., mask and substrate planes) can be improved.

According to some embodiments, the method includes a clamping or fixing of the substrate carrier to the holding arrangement before moving the substrate carrier and the mask carrier relative to each other using the first alignment actuator and the second alignment actuator in block 720. As an example, the substrate carrier can be fixed to the holding arrangement by a magnetic force.

In some implementations, the method includes a clamping or fixing of a mask carrier to the holding arrangement before moving the substrate carrier and the mask carrier relative to each other by the first alignment actuator and the second alignment actuator in block 720. As an example, the mask carrier can be fixed to the holding arrangement by a magnetic force.

In some implementations, the method in block 730 includes determining of a position of the substrate, or the substrate carrier, with respect to the mask carrier or a mask, in particular wherein movement of the substrate carrier and the mask carrier relative to each other using the first alignment actuator and the second alignment actuator includes movement of the substrate carrier or mask carrier to align the substrate, or the substrate carrier, with respect to the mask carrier or the mask.

According to embodiments described herein, the method for aligning a substrate carrier supporting a substrate for layer deposition in a processing chamber and the mask carrier can be conducted by means of computer programs, software, computer software products and the interrelated controllers, which can have a CPU, a memory, a user interface, and input and output means being in communication with the corresponding components of the apparatus for processing a large area substrate.

FIGS. 8A-E show a sequence for aligning a substrate for layer deposition in a processing chamber according to embodiments described herein.

Figure 8A:
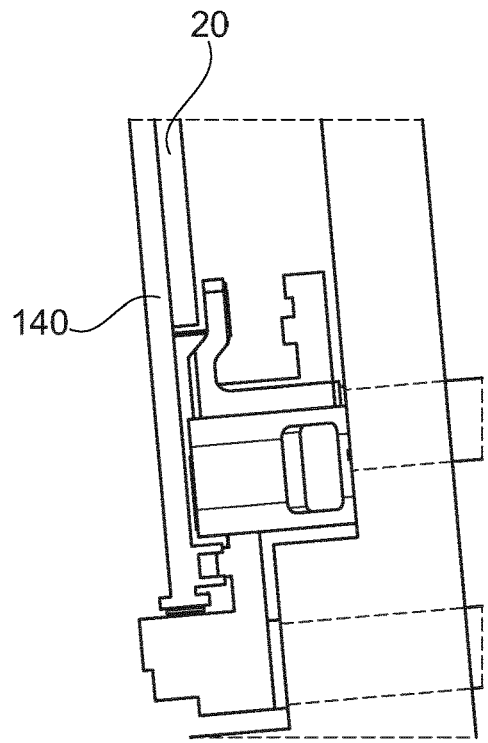
FIGS. 8A-F show a sequence for aligning a substrate for layer deposition in a processing chamber according to embodiments described herein.
Figure 8B:
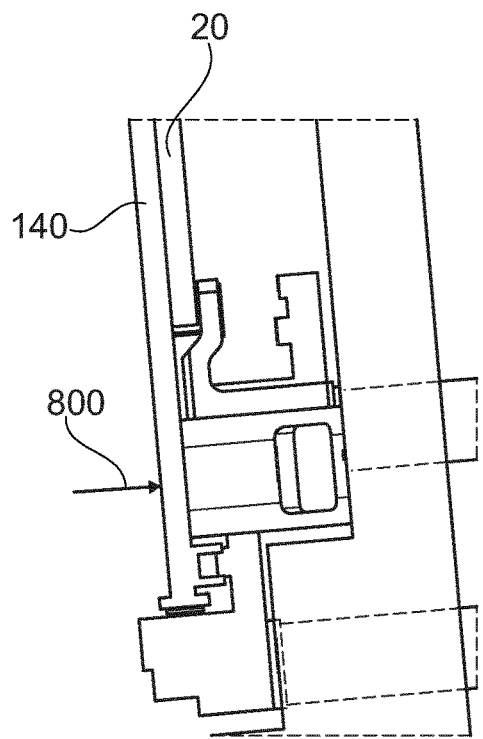

In a first sequence aspect, as shown in FIG. 8A, the mask carrier 140 having the mask 20 mounted thereon enters the processing chamber. In a second sequence aspect (FIG. 8B), the mask carrier 140 is locked by the one or more second fixing devices 270. As an example, the mask carrier 140 can be locked by making a movement of about 5 mm in the third direction (indicated with reference numeral 800; "z-move") with respect to the two or more alignment actuators. In some implementations, the mask carrier can be fixed or locked by a magnetic force.

Figure 8C:
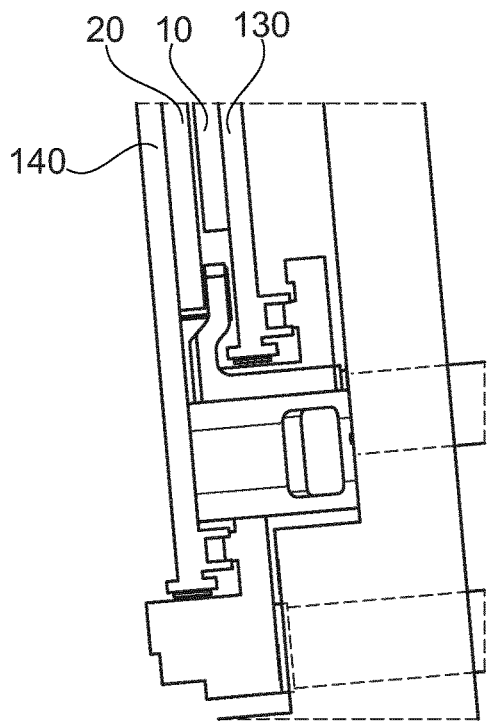
Figure 8D:
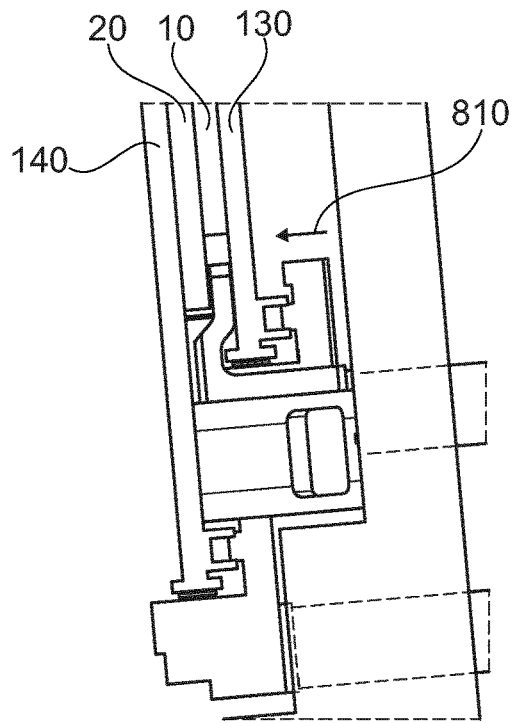

Referring to FIG. 8C, in a third sequence aspect, the substrate carrier 130 enters the processing chamber. In some implementations, an inspection system can determine a position and/or an orientation of the substrate carrier 130, e.g., with respect to the mask carrier 140 or mask 20. As an example, the inspection system can include one or more cameras configured to take pictures of at least a portion of the substrate carrier 130. Based on the determined position and/or orientation, the two or more alignment actuators can perform a pre-positioning of the substrate carrier 130. As an example, the two or more alignment actuators can move the substrate carrier 130 to within a predetermined range, e.g., a tolerance range. Movement of the substrate carrier 130 can, for example, include a movement in the x-direction and the y-direction, and can include an angular positioning (theta-positioning) in, or parallel to, the first plane.

In a fourth sequence aspect (FIG. 8D), the substrate carrier 130 is locked by the one or more first fixing devices. As an example, the substrate carrier 130 can be locked by making a movement of about 5 mm in the third direction (indicated with reference numeral 810; "z-move") with respect to the two or more alignment actuators. In some implementations, the substrate carrier can be fixed or locked by a magnetic force.

Figure 8E:
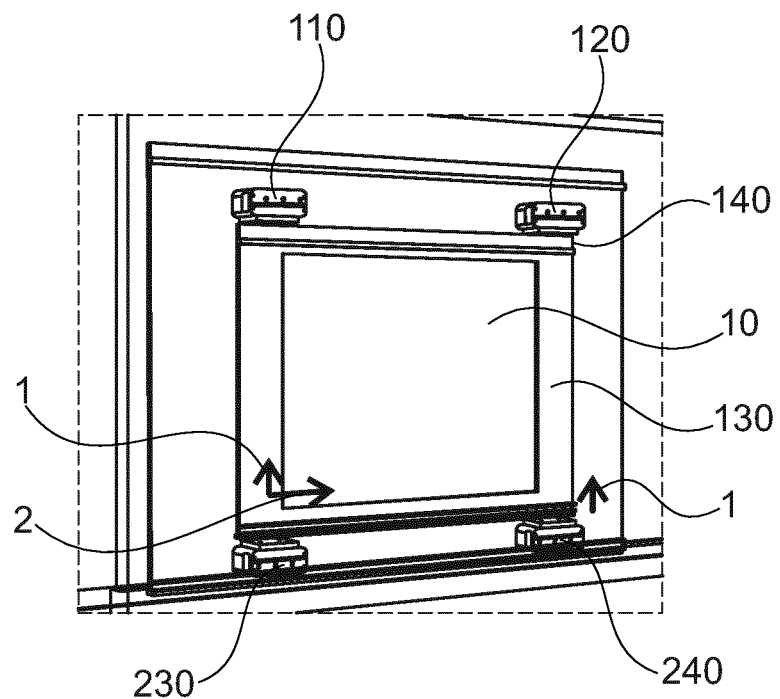

Referring to FIG. 8E, in a fifth sequence aspect, the inspection system can determine a position and/or an orientation of the substrate carrier 130, e.g., with respect to the mask carrier 140 or mask 20. Based on the determined position and/or orientation, the two or more alignment actuators can perform a pre-alignment of the substrate carrier 130. As an example, the two or more alignment actuators can move the substrate carrier 130 in the x-direction and the y-direction, and can perform an angular positioning (theta-positioning) in, or parallel to, the first plane.

Figure 8F:
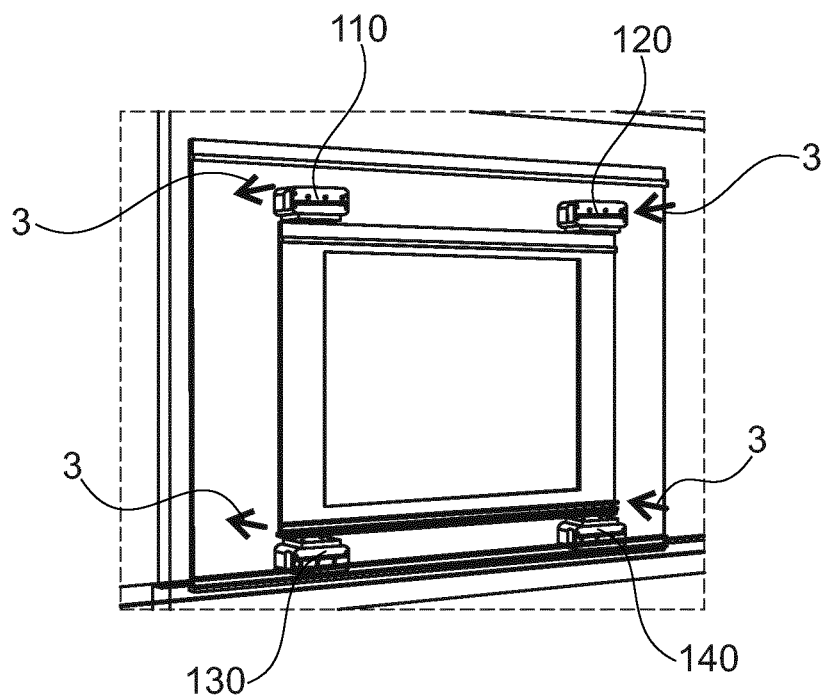

In a sixth sequence aspect (FIG. 8F), a distance between the substrate carrier 130, or substrate, and the mask carrier 140, or mask, is reduced to about 50 micro meters by a movement of the substrate carrier 130 in the z-direction ("z-approach").

In a seventh sequence aspect, similar to the FIG. 8E and the fifth sequence aspect, the inspection system can determine a position and/or an orientation of the substrate carrier 130, e.g., with respect to the mask carrier 140 or mask 20. Based on the determined position and/or orientation, the two or more alignment actuators can perform a fine-alignment of the substrate carrier 130. As an example, the two or more alignment actuators can move the substrate carrier 130 in x-direction and y-direction, and can perform an angular positioning (theta-positioning) of the substrate carrier 130 in, or parallel to, the first plane.

The present disclosure provides a holding arrangement with two or more alignment actuators, which provide a short connection path between the mask carrier and the substrate carrier. The holding arrangement is less susceptible to external interference. The two or more alignment actuators allow for an alignment of the substrate and the mask, and layers can be deposited with an improved alignment.

While the foregoing is directed to embodiments of the disclosure, other and further embodiments of the disclosure may be devised without departing from the basic scope thereof, and the scope thereof is determined by the claims that follow.

The invention claimed is:

1. A holding arrangement for supporting a substrate carrier and a mask carrier in, or parallel to, a first plane, comprising:
   two alignment actuators, each alignment actuator comprising a first fixing device configured to hold the substrate carrier and a second fixing device to hold the mask carrier, the two alignment actuators comprising:
      a first alignment actuator configured to be connected to the substrate carrier and the mask carrier and to move the substrate carrier and the mask carrier relative to each other at least in a first direction; and
      a second alignment actuator configured to be connected to the substrate carrier and the mask carrier and to move the substrate carrier and the mask carrier relative to each other at least in the first direction and a second direction different from the first direction, and wherein the first direction and the second direction are in a first plane.

2. The holding arrangement of claim 1, wherein the two alignment actuators are configured to move the substrate carrier relative to the mask carrier or to move the mask carrier relative to the substrate carrier.

3. The holding arrangement of claim 1, wherein the first direction and the second direction are perpendicular to each other.

4. The holding arrangement of claim 1, wherein the holding arrangement is configured for supporting at least one of the substrate carrier and the mask carrier in a vertical orientation.

5. The holding arrangement of claim 1, wherein the first plane is parallel to a plane of a substrate surface configured for layer deposition thereon.

6. The holding arrangement of claim 1, further comprising a third alignment actuator and a fourth alignment actuator.

7. The holding arrangement of claim 1, wherein at least one alignment actuator of the two alignment actuators is configured to move the substrate carrier and the mask carrier relative to each other in a third direction.

8. The holding arrangement of claim 1, wherein each of the first fixing devices are configured for fixing the substrate carrier to the holding arrangement.

9. The holding arrangement of claim 1, wherein each of the second fixing devices are configured for fixing the mask carrier to the holding arrangement.

10. The holding arrangement of claim 8, wherein each of the first fixing devices are first magnetic fixing devices.

11. The holding arrangement of claim 9, wherein each of the second fixing devices are second magnetic fixing devices.

12. The holding arrangement of claim 1, wherein the holding arrangement is mountable or connectable to a chamber wall of a processing chamber.

13. The holding arrangement of claim 1, wherein the two alignment actuators are connectable to corner regions of at least one of the substrate carrier and the mask carrier.

* * * * *